United States Patent
Uchiyama et al.

(10) Patent No.: US 9,005,489 B2
(45) Date of Patent: Apr. 14, 2015

(54) SPUTTERING TARGET OF OXIDE SEMICONDUCTORS AND THE MANUFACTURING METHODS OF OXIDE SEMICONDUCTOR LAYERS

(75) Inventors: Hiroyuki Uchiyama, Musashimurayama (JP); Hironori Wakana, Tokorozawa (JP)

(73) Assignee: Hitachi Metals, Ltd., Tokyo (JP)

( * ) Notice: Subject to any disclaimer, the term of this patent is extended or adjusted under 35 U.S.C. 154(b) by 954 days.

(21) Appl. No.: 13/049,869

(22) Filed: Mar. 16, 2011

(65) Prior Publication Data
US 2012/0025148 A1 Feb. 2, 2012

(30) Foreign Application Priority Data

Jul. 30, 2010 (JP) ................. 2010-171817

(51) Int. Cl.
| | |
|---|---|
| *H01B 1/08* | (2006.01) |
| *H01L 21/02* | (2006.01) |
| *C23C 14/08* | (2006.01) |
| *C23C 14/34* | (2006.01) |

(52) U.S. Cl.
CPC ........ *H01L 21/02631* (2013.01); *C23C 14/086* (2013.01); *C23C 14/3414* (2013.01); *H01L 21/02554* (2013.01); *H01L 21/02565* (2013.01); *H01L 21/02573* (2013.01)

(58) Field of Classification Search
CPC .. C23C 14/3414; C23C 14/086; C23C 14/08; H01B 1/08; H01B 1/02
USPC .......................... 252/519.51, 520.1; 428/432; 204/298.13, 192.15
See application file for complete search history.

(56) References Cited

U.S. PATENT DOCUMENTS

| | | | |
|---|---|---|---|
| 6,852,623 B2 | 2/2005 | Park et al. | |
| 7,906,777 B2 | 3/2011 | Yano et al. | |
| 2006/0113539 A1 | 6/2006 | Sano et al. | |
| 2006/0113565 A1 | 6/2006 | Abe et al. | |
| 2007/0215456 A1 * | 9/2007 | Abe et al. | 204/192.15 |
| 2010/0330738 A1 | 12/2010 | Uchiyama et al. | |
| 2011/0260121 A1 * | 10/2011 | Yano et al. | 252/519.51 |

FOREIGN PATENT DOCUMENTS

| | | |
|---|---|---|
| JP | 2006-165532 A | 6/2006 |
| JP | 2006-173580 A | 6/2006 |
| JP | 2007-142196 A | 6/2007 |
| KR | 10-2004-0079516 | 9/2004 |
| WO | WO 2010067571 A1 * 6/2010 | ............. C23C 14/34 |

OTHER PUBLICATIONS

Office Action issued Mar. 19, 2013, in Korean Patent Application No. 10-2011-21313.

* cited by examiner

*Primary Examiner* — Mark Kopec
*Assistant Examiner* — Haidung Nguyen
(74) *Attorney, Agent, or Firm* — Miles & Stockbridge P.C.

(57) ABSTRACT

A technique capable of forming an oxide semiconductor target with a high quality in a low cost is provided. In a step of manufacturing zinc tin oxide (ZTO target) used in manufacturing an oxide semiconductor forming a channel layer of a thin-film transistor, by purposely adding the group IV element (C, Si, or Ge) or the group V element (N, P, or As) to a raw material, excessive carriers caused by the group III element (Al) mixed in the step of manufacturing the ZTO target are suppressed, and a thin-film transistor having good current (Id)-voltage (Vg) characteristics is achieved.

12 Claims, 9 Drawing Sheets

US 9,005,489 B2

SPUTTERING TARGET OF OXIDE SEMICONDUCTORS AND THE MANUFACTURING METHODS OF OXIDE SEMICONDUCTOR LAYERS

CROSS-REFERENCE TO RELATED APPLICATION

The present application claims priority from Japanese Patent Application No. 2010-171817 filed on Jul. 30, 2010, the content of which is hereby incorporated by reference into this application.

TECHNICAL FIELD OF THE INVENTION

The present invention relates to an oxide semiconductor target and a method of manufacturing an oxide semiconductor film with using the oxide semiconductor target. More particularly, the present invention relates to a technique effectively applied to an oxide semiconductor target formed of a sintered oxide mainly made of zinc oxide and tin oxide, and a method of manufacturing an oxide semiconductor film with using the oxide semiconductor target by a sputtering method or a deposition method.

BACKGROUND OF THE INVENTION

In recent years, a display device has been developed from a display device with using a cathode-ray tube to a flat-type display device called a flat panel display (FPD) such as a liquid crystal display and a plasma display. In the FPD, for a switching element for display switching by liquid crystal, a thin-film transistor is adopted. For example, for a switching element of the liquid crystal display, a thin-film transistor in which amorphous silicon or polycrystalline silicon is used for a channel layer is adopted. For such a FPD, it is required to add new functions such as further increase of the area and flexibility, and it is required to provide high performance as an imaging element device as well as handle a process capable of manufacturing the large-area FPD and handle to a flexible substrate.

Also, recently, in order to achieve a further larger area or more flexibility, an organic EL display with using organic electro luminescence (EL) has been developed. Also in the organic EL display, for the switching element, a thin-film transistor is adopted. However, the organic EL display is a self light emitting device which directly obtains light emission by driving an organic semiconductor layer, and therefore, characteristics as a current-driving device are required for the thin-film transistor as different from the liquid crystal display.

From such a background, in order to improve transistor characteristics of the thin-film transistor for the display device, in recent years, a study has been made, in which an oxide semiconductor whose band gap is large as about 3 eV, which is transparent, and which can be deposited at a low temperature is adopted for a channel layer of the thin-film transistor. The adoption of the oxide semiconductor for not only the display device but also a thin-film memory or individual discrimination (Radio Frequency Identification: RFID) by radio waves or others has been expected.

Although zinc oxide or tin oxide is generally used as the oxide semiconductor forming the channel layer of the thin-film transistor, a problem of easy threshold potential shift arises for the thin-film transistor with using the materials. Accordingly, as an oxide semiconductor capable of suppressing the threshold potential shift of the thin-film transistor, indium gallium zinc oxide (IGZO) has been proposed.

For example, Japanese Patent Application Laid-Open Publication No. 2006-165532 (Patent Document 1) discloses a semiconductor device which includes a P-type region and an N-type region and in which amorphous oxide whose electronic carrier concentration is lower than $10^{18}/cm^3$ is used for the N-type region, and discloses that the amorphous oxide is oxide containing indium (In), gallium (Ga), and zinc (Zn).

Also, Japanese Patent Application Laid-Open Publication No. 2006-173580 (Patent Document 2) discloses a field effect transistor which includes an active layer made of amorphous oxide whose electronic carrier concentration is lower than $10^{18}/cm^3$ or amorphous oxide having a tendency of increase in electronic mobility together with the increase in the electronic carrier concentration, and the field effect transistor in which at least one of a source electrode, drain electrode, and a gate electrode has transparency to visible-range light, and disclose that the amorphous oxide is oxide containing In, Zn, and Ga.

It is confirmed that the thin-film transistor in which the IGZO is adopted for the channel layer has a better subthreshold slope value than that of the thin-film transistor in which the polycrystalline silicon is adopted for the channel layer. Also, the adoption of the IGZO for not only the display device but also other devices requiring extremely-low voltage operation or extremely-low power consumption has been expected. However, on the other hand, the IGZO contains In or Ga of a significant amount in which exhaustion of its resource or uneven distribution of the resource is concerned, and therefore, the IGZO would be disadvantageous for industrial use in future.

Accordingly, the inventors of the present application have studied on zinc tin oxide (ZTO) as an oxide semiconductor without In. As a result, in the thin-film transistor in which the ZTO is adopted for the channel layer, transistor characteristics equivalent to that of the thin-film transistor in which the IGZO is adopted for the channel layer have could been obtained. Also, it is assumed that, in future, a large market would be established also for the oxide semiconductor target used in depositing the oxide semiconductor by a sputtering method or a deposition method. However, at that time, from a point of view in a cost or securing of the resource, it is considered that a material as the ZTO without rare metal is more advantageous than a material with rare metal such as In and Ga.

SUMMARY OF THE INVENTION

A film (hereinafter, referred to as oxide semiconductor film) made of an oxide semiconductor is generally formed by a sputtering method with using a target formed by sintering the oxide semiconductor. However, from studies made by the inventors of the present application, problems described below have been found out.

Steps of manufacturing the oxide semiconductor target used for the sputtering method include: a microparticulation/slurry mixture step of powder materials to be a raw material; a molding step; a sintering step; and a polishing step. When the ZTO is deposited, high-purity particles (for example, 99.99% or higher) of zinc oxide and tin oxide are used as the powder materials to be the raw material. In the microparticulation/slurry mixture step of the powder materials, with using crushing balls of a ball mill, the powder materials are sufficiently mixed in order to obtain a sintered body without composition distribution. However, a material of the crushing ball introduced into the ball mill is alumina ($Al_2O_3$), and therefore, aluminium (Al) of about 0.1 to 1.0 wt % (0.3 to 3.2 at %) to be a donor is adversely mixed into the sintered body as an impurity. If the sintered body is used as the target in the sputtering method, the Al is adversely added to the formed oxide semiconductor film as the impurity. Therefore, in the thin-film transistor in which the oxide semiconductor film is adopted for the channel layer, the oxide semiconductor film cannot be functioned as a semiconductor, and therefore, a problem such that the off operation is impossible in the thin-film transistor arises.

In order to prevent the mixture of the impurities from the crushing balls, it is considered that crushing balls with less impurity are used, crushing and mixture techniques except for the ball mill are used, the powder materials are highly purified, manufacturing environment is cleaned, or others. However, any consideration results in increase of the manufacturing cost.

A preferred aim of the present invention is to provide a technique capable of forming an oxide semiconductor target with a high quality in a low cost.

Also, another preferred aim of the present invention is to provide a technique capable of obtaining a stable quality in an oxide semiconductor film formed with using an oxide semiconductor target.

The above and other preferred aims and novel characteristics of the present invention will be apparent from the description of the present specification and the accompanying drawings.

The typical ones of the inventions disclosed in the present application will be briefly described as follows.

As an embodiment, in an oxide semiconductor target formed of a sintered oxide mainly made of zinc oxide and tin oxide, the group IV element, the group V element, or both elements of the group IV element and the group V element are added to the sintered oxide, and an impurity concentration of the group IV element, an impurity concentration of the group V element, or an impurity concentration of both elements of the group IV element and the group V element, which are added to the sintered oxide, are equal to or less than ½ times an impurity concentration of the group III element contained in the sintered oxide.

Also, as another embodiment, in a method of manufacturing an oxide semiconductor film formed on a substrate with using an oxide semiconductor target formed of a sintered oxide mainly made of zinc oxide and tin oxide, the group IV element, the group V element, or both elements of the group IV element and the group V element are added to the sintered oxide, and an impurity concentration of the group IV element, an impurity concentration of the group V element, or an impurity concentration of both elements of the group IV element and the group V element, which are added to the sintered oxide, are equal to or less than ½ times an impurity concentration of the group III element contained in the sintered oxide.

The effects obtained by typical aspects of the present invention will be briefly described below.

An oxide semiconductor target with a high quality in a low cost can be formed. Also, in an oxide semiconductor film formed with using the oxide semiconductor target, a stable quality can be obtained.

BRIEF DESCRIPTIONS OF THE DRAWINGS

Figure 12:
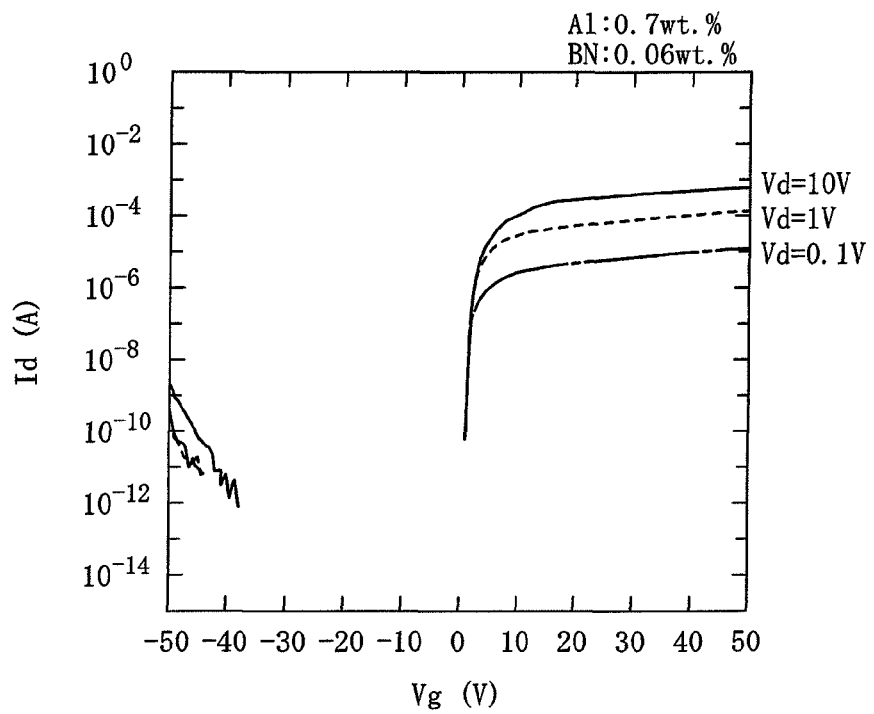
Figure 13:
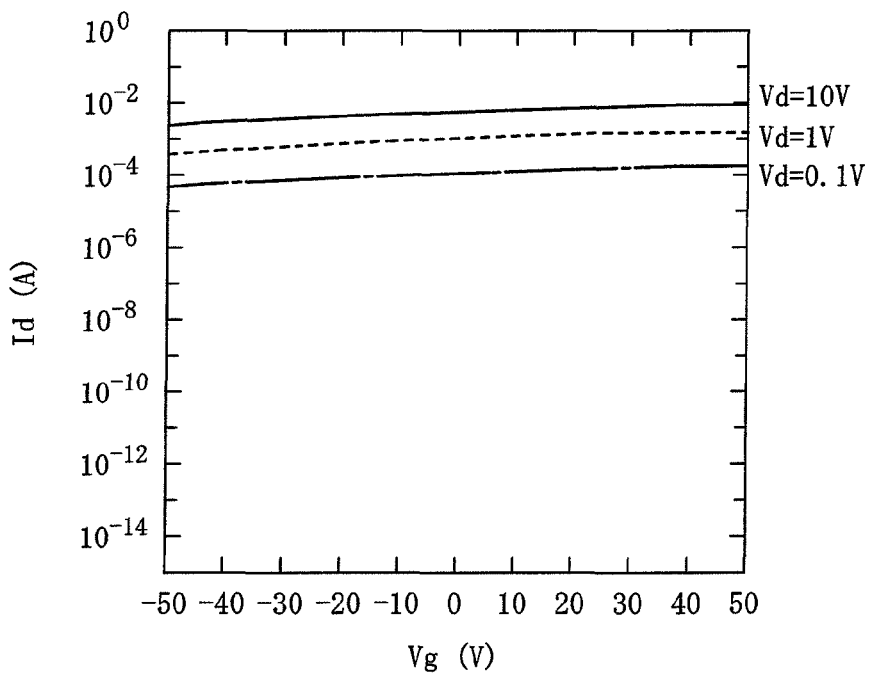

FIG. 12 is a graph illustrating current-voltage characteristics of a thin-film transistor in which an oxide semiconductor film formed by an electron-beam deposition method with using an oxide semiconductor target with the addition of a counter doping material (BN) according to the second embodiment of the present invention is adopted for the channel layer; and FIG. 13 is a graph illustrating current-voltage characteristics of a thin-film transistor in which an oxide semiconductor film formed by an electron-beam deposition method with using an oxide semiconductor target without the addition of the counter doping element studied by the inventors of the present application is adopted for the channel layer.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Still further, in some drawings used in the embodiments, hatching is used even in a plan view so as to make the drawings easy to see. Still further, components having the same function are denoted by the same reference symbols throughout the drawings for describing the embodiments, and the repetitive description thereof is omitted. Hereinafter, embodiments of the present invention will be described in detail with reference to the accompanying drawings.

(First Embodiment)

In the invention of the present application, by adding the group IV element, the group V element, or both of the group IV element and group V element, which have a role of canceling a carrier, to the oxide semiconductor as a counter impurity element (counter doping element or counter doping material) against the group III element (boron (B), Al, Ga, or In) which is an impurity element generating the carrier (in a case of oxide, that is electron caused by oxygen defect) as a donor, the number of carriers in the oxide semiconductor is controlled.

Figure 1:
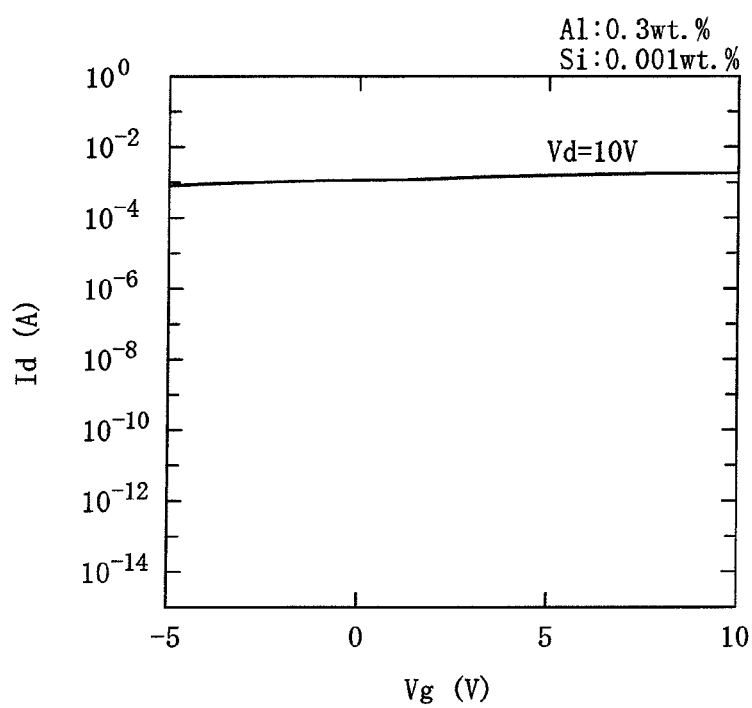
FIG. 1 is a graph illustrating current-voltage characteristics of a thin-film transistor in which an oxide semiconductor film formed with using an oxide semiconductor target whose purity is 2 N level studied by the inventors is adopted for a channel layer.

FIG. 1 is a graph illustrating current (Id)-voltage (Vg) characteristics of a thin-film transistor in which, Al (the group III element) is purposely added to a raw material in a manufacturing step for a ZTO target to lower a purity of the ZTO target down to 2 N level, and a ZTO film formed with using the ZTO target is adopted for the channel layer.

A normal thin-film transistor has to show current-voltage characteristics such that the current is rapidly increased at a threshold voltage whose voltage is about 0 V and the current is saturated by the increase of the voltage. However, in the thin-film transistor in which the ZTO film formed with using the ZTO target whose purity is 2 N level is adopted for the channel layer, the OFF state cannot be obtained in a negative bias region, and therefore, it is found out that a switching operation is impossible. At this time, the impurity concentration of Al in the ZTO target is 0.3 wt % (1.1 at %), and therefore, a reason that the OFF state cannot be obtained in the negative bias region may be the increase of the carrier in the ZTO due to the mixture of Al.

Accordingly, by adding the group IV element, the group V element, or both of the group IV element and the group V element whose electronegativities are larger than that of the group III element, the carrier (electron) caused by the addition of the group III element is cancelled, and the number of the carriers are suppressed.

Figure 2:
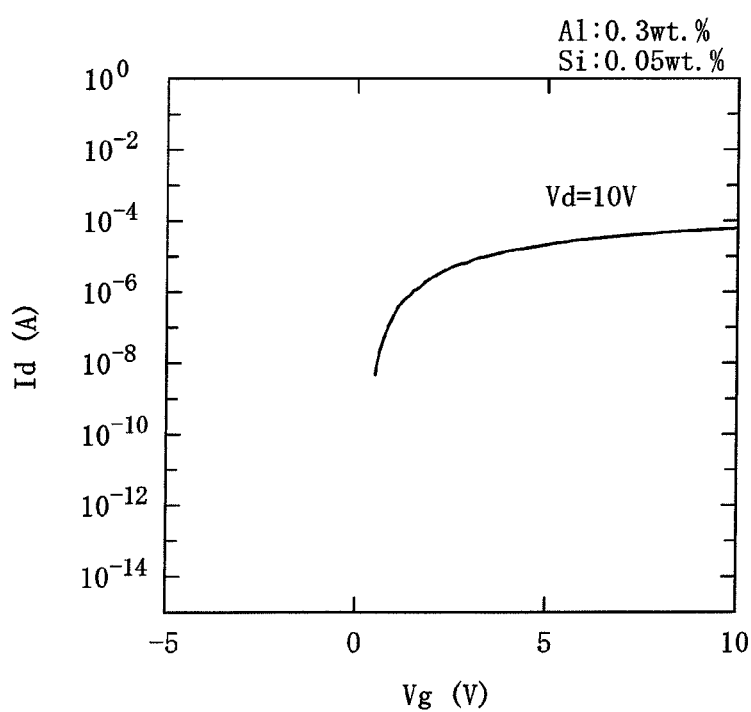
FIG. 2 is a graph illustrating current-voltage characteristics of a thin-film transistor in which an oxide semiconductor film formed with using an oxide semiconductor target (with the addition of $SiO_2$ fine particles whose purities are 99.99% or higher) according to a first embodiment of the present invention is adopted for the channel layer.

FIG. 2 is a graph illustrating current (Id)-voltage (Vg) characteristics of a thin-film transistor in which silicon oxide ($SiO_2$) fine particles with a high purity (99.99% or higher) are purposely added to the raw material in the manufacturing step for the ZTO target to manufacture the ZTO target, and a ZTO film formed with using the ZTO target is adopted for the channel layer. Here, the $SiO_2$ fine particles are added to the raw material so that an impurity concentration of silicon (Si) which is the group IV element in the $SiO_2$ fine particles is about $1/15$ times the impurity concentration of Al (about 0.3 wt % (1.1 at %) of the raw material) which is the group III element.

It can be found out that the carrier in the ZTO film is suppressed by adding Si, and the good current-voltage characteristics are obtained. In this manner, for suppressing the excessive carriers caused by the group III element mixed in the manufacturing step for the ZTO target, it is effective to add the group IV element or the group V element with an appropriate impurity concentration in accordance with the impurity concentration of the group III element.

Figure 3:
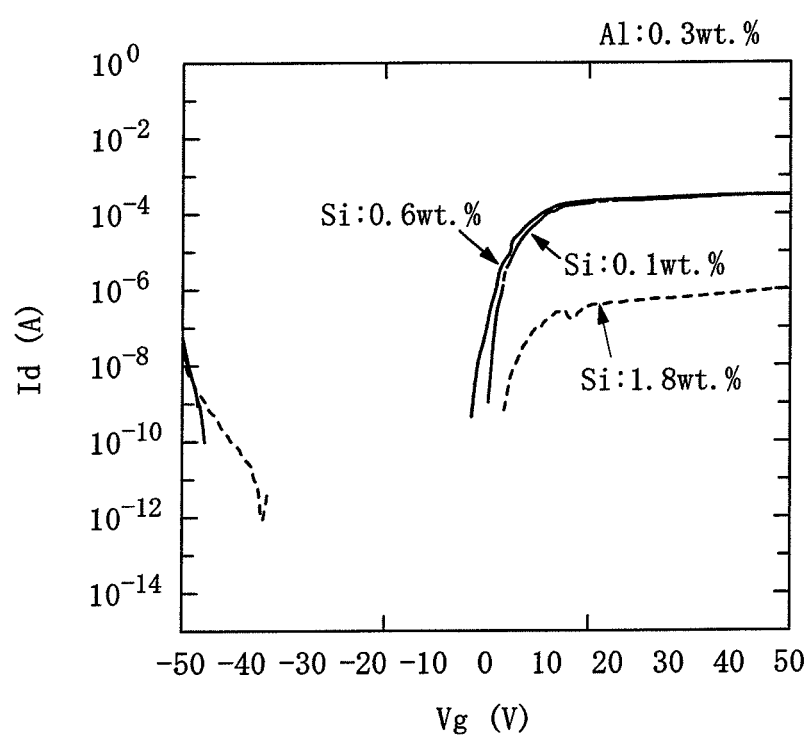
FIG. 3 is a graph illustrating current-voltage characteristics of a thin-film transistor in which an oxide semiconductor film formed with using an oxide semiconductor target according to the first embodiment of the present invention is adopted for the channel layer.

FIG. 3 is a graph illustrating current (Id)-voltage (Vg) characteristics of a thin-film transistor with using the impurity concentration of Si as a parameter, in which a ZTO film formed with using a ZTO target is adopted for the channel layer. The concentration of Si is 0.1 wt %, 0.6 wt %, and 1.8 wt %, and the impurity concentration of Al is 0.3 wt %.

The impurity concentration of the group IV or V element which is effective as the counter doping element is equal to or less than $1/2$ times, more preferably $1/10$ times the impurity concentration of the group III element. In other words, a ratio of the impurity concentration (A) of the group IV or V element which is effective as the counter doping element and the impurity concentration (B) of the group III element is as A/B≤0.5, more preferably A/B≤0.1. As illustrated in FIG. 3, since a carrier-capture site is increased by adding a counter doping element with a higher concentration than that of the ratio, the subthreshold slope value is deteriorated or the threshold potential shift caused by the bias stress is increased, and therefore, these situations are not effective as the transistor characteristics.

Next, the oxide semiconductor target used for the sputtering method according to the first embodiment is described in detail.

An example of a method of manufacturing the oxide semiconductor target used for the sputtering method is described below.

First, each of zinc oxide powder and tin oxide powder with a high purity (for example, 99.99% or higher) is weighed to an amount of a mole fraction so that a composition ratio of Zn/(Zn+Sn) is 0.7. The raw material powder (the zinc oxide powder and the tin oxide powder), $SiO_2$ fine particles with the high purity (for example, 99.99% or higher), and the alumina ball are introduced into the ball mill, and the raw material powder is mixed with a water-based solvent to be slurry. The time for the mixture is set to 5 hours or longer. After sufficiently mixing, a binder such as polyvinyl alcohol is added to the slurry raw material, and further the slurry raw material is formed by a mold.

Since the alumina ball with a high hardness is used in the mixture of the raw material powder, the raw material of the ZTO target can homogenize. Also, a concentration of the mixed alumina can be easily predicted by setting a grinding condition or a mixture condition, and a concentration of the $SiO_2$ fine particles can be set in accordance with the concentration, and therefore, the impurity concentration in the manufactured ZTO target can be easily controlled. Further, while a material cost of the $SiO_2$ fine particles mixed as the counter doping material is increased, other costs are not increased, and therefore, a cheap alumina ball can be used in the mixture of the raw material, and thus, the ZTO target can be provided in a low cost. By these manners, the ZTO target with the low cost and the high quality can be provided.

Next, in order to remove the binder, the slurry raw material is heated at a temperature of about 600° C. for several hours under air to be solidified. Further, the solidified raw material (solid material) is sintered at a temperature of about 1300° C. for 5 hours or longer under air or oxygen atmosphere to be a sintered body whose relative density is 95% or higher. And then, the sintered body is molded in a required shape by polishing, so that the ZTO target is completed. The completed ZTO target is bonded on, for example, a rear plate of a cathode electrode in a sputtering apparatus.

Under the manufacturing condition, it is assumed that the impurity concentration of the Al (the group III element) due to the alumina ball mixed into the raw material is about 0.3 to 1.0 wt % (1.1 to 3.2 at %). Also, the $SiO_2$ fine particles with the high purity (99.99% or higher) are added so that the impurity concentration of the Si (the group IV element) is about ⅓ times the impurity concentration of the Al.

A shade of the ZTO target for forming the semiconductor film obtained by the above-described manufacturing method is shiny and whitish-gray. Since an oxide target with more oxygen defects which is generally used as a target for forming a transparent conductive film has a dark black color, the ZTO target for forming the semiconductor film and the target for forming the transparent conductive film can be obviously distinguished from each other. Also, a resistivity of the ZTO target for forming the semiconductor film obtained by measurement with using a four probe method is $1\times10^{-1}$ Ωcm or higher. Since a resistivity of the target for forming the transparent conductive film is generally $1\times10^{-3}$ Ωcm or lower, both have a large difference from each other even in the resistivity.

Figure 4:
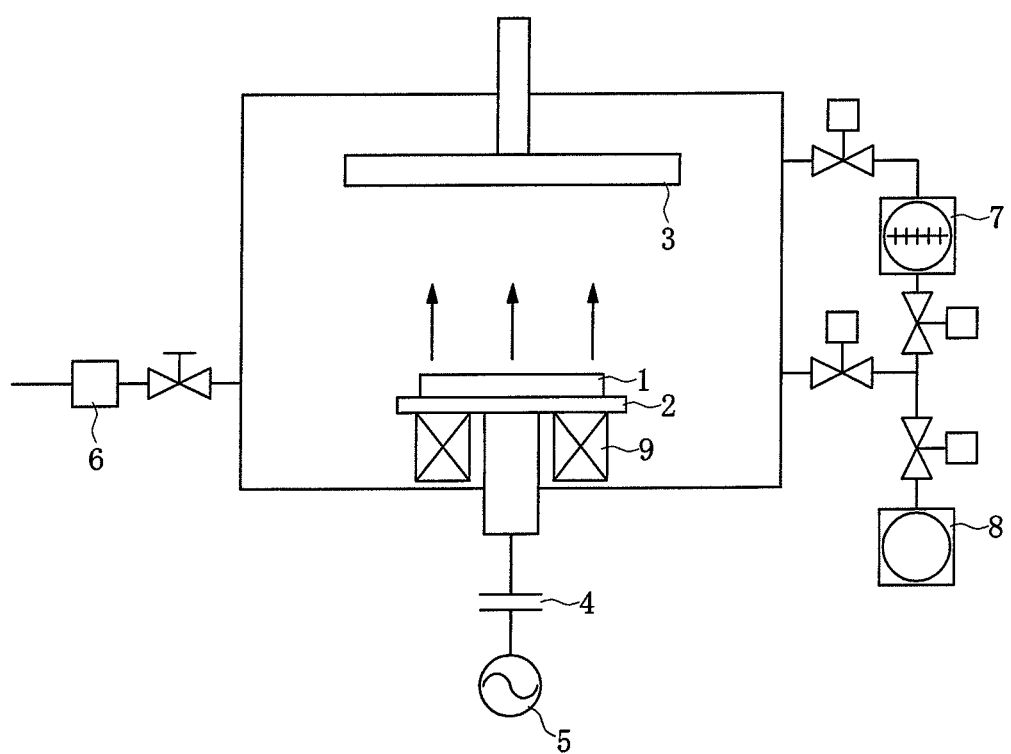
FIG. 4 is a schematic diagram of an RF magnetron sputtering apparatus with using the oxide semiconductor target according to the first embodiment of the present invention.

The discharge by DC bias is difficult in the ZTO target manufactured as described above, and therefore, the ZTO film is formed by a sputtering method by RF bias. FIG. 4 illustrates a schematic diagram of an RF magnetron sputtering apparatus with using the ZTO target according to the first embodiment. In FIG. 4, a numerical symbol 1 denotes the ZTO target, a numerical symbol 2 denotes the cathode electrode (the rear plate of the target), a numerical symbol 3 denotes an opposite electrode (also functioning as a sample holder), a numerical symbol 4 denotes a matching box, a numerical symbol 5 denotes an RF power supply, a numerical symbol 6 denotes a mass flow controller, a numerical symbol 7 denotes a cryopump or a molecule turbo pump, a numerical symbol 8 denotes a dry pump or rotary pump, and a numerical symbol 9 denotes a magnet (for the magnetron sputtering).

With using the ZTO target 1 obtained by the above-described manufacturing method, under conditions of argon (Ar) gas with the addition of oxygen gas of 5% or higher (for example, about 15%) as a sputtering gas, pressure of 0.5 Pa, RF power density of 2.65 W/cm$^2$, and an inter-electrode distance of 80 mm, the resistivity of the formed ZTO film is about 2.0 Ωcm.

Next, a manufacturing method for the thin-film transistor according to the first embodiment is sequentially described with reference to FIGS. 5 and 6. The oxide semiconductor film forming the channel layer of the thin-film transistor is formed by the sputtering method with using the ZTO target according to the invention of the present application. Each of FIGS. 5 and 6 is a cross-sectional view of a principal part illustrating a structure of the thin-film transistor in which the ZTO film formed with using the ZTO target is adopted for the channel layer.

Figure 5A:
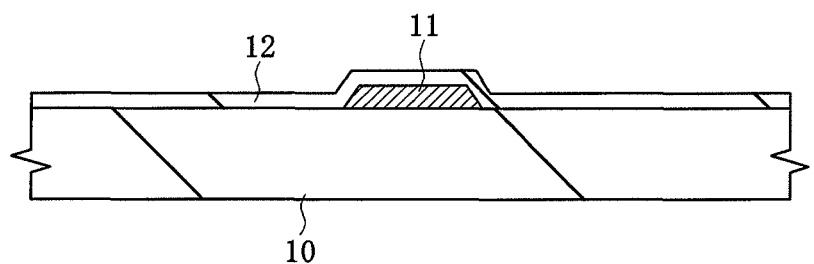
FIG. 5A is a cross-sectional view of a principal part of a thin-film transistor for explaining a step of manufacturing the thin-film transistor in which the oxide semiconductor film formed with using the oxide semiconductor target according to the first embodiment of the present invention is adopted for the channel layer.

First, as illustrating in FIG. 5A, a support substrate 10 such as a glass substrate, a quartz substrate, a sapphire substrate, a resin substrate, and a film is prepared. Next, on the support substrate 10, a metal thin film such as a stacked film made of Al and molybdenum (Mo) (Al/Mo stacked film) is formed by a deposition method, a sputtering method, or other, and the metal thin film is patterned by a liftoff process or an etching process to form a gate electrode 11. A thickness of the Al film is, for example, 250 nm, and a thickness of the Mo film is, for example, 50 nm. Next, on an upper layer of the film, a gate insulator film 12 formed of an oxide film (for example, silicon oxide film), a nitride film (for example, silicon nitride film), or others whose thickness is, for example, about 100 nm is deposited by a sputtering method, a chemical vapor deposition (CVD) method, a deposition method, or others.

Figure 5B:
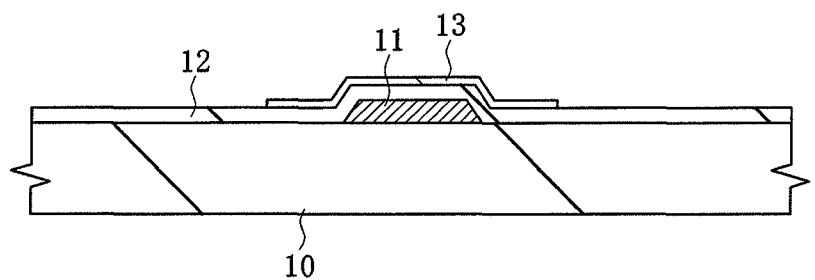
FIG. 5B is a cross-sectional view of a principal part of a thin-film transistor for explaining a step of manufacturing the thin-film transistor in which the oxide semiconductor film formed with using the oxide semiconductor target according to the first embodiment of the present invention is adopted for the channel layer.

Next, as illustrated in FIG. 5B, on an upper layer of the gate insulator film 12, the ZTO film is formed by the RF magnetron sputtering method with using the ZTO target. Subsequently, the ZTO film is processed with using a resist pattern as a mask by a wet etching method with using an oxalic-acid based etchant or a hydrochloric-acid based etchant to form a channel layer 13. Although a thickness of the channel layer 13 (ZTO film) depends on an adopted device, about 5 nm to 75 nm is desirable.

Figure 5C:
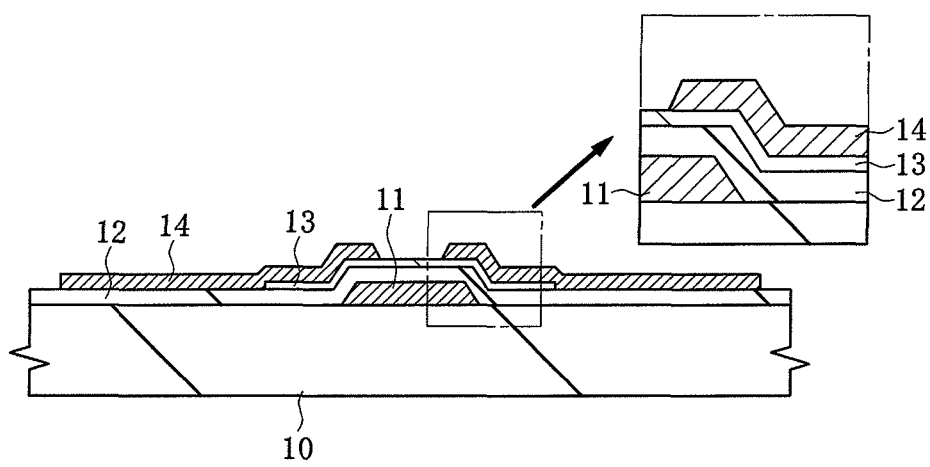
FIG. 5C is a cross-sectional view of a principal part of a thin-film transistor for explaining a step of manufacturing the thin-film transistor in which the oxide semiconductor film formed with using the oxide semiconductor target according to the first embodiment of the present invention is adopted for the channel layer.

Next, as illustrated in FIG. 5C, on an upper layer of the channel layer 13 formed of the ZTO film, a conductive film is formed by a deposition method, a sputtering method, or others. Subsequently, the conductive film is patterned by a liftoff process or an etching process to form a source-drain electrode 14.

Figure 6A:
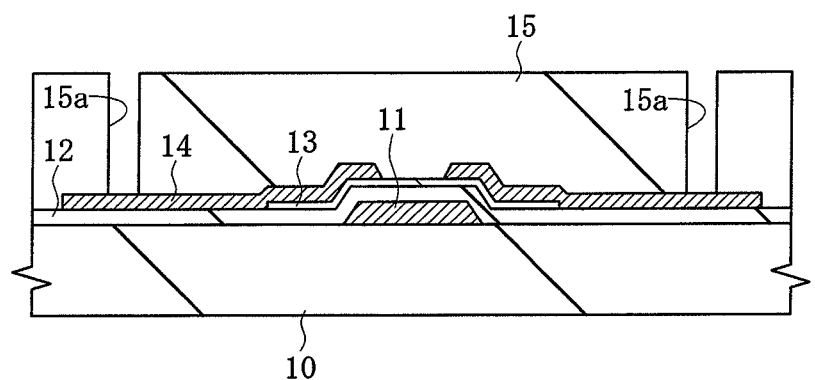
FIG. 6A is another cross-sectional view of the principal part of the thin-film transistor for explaining a step of manufacturing the thin-film transistor in which the oxide semiconductor film formed with using the oxide semiconductor target according to the first embodiment of the present invention is adopted for the channel layer.

Next, as illustrated in FIG. 6A, a passivation film 15 for covering the channel layer 13 and the source-drain electrode 14 is formed. Subsequently, the passivation film 15 is processed with using a resist pattern as a mask to form a contact hole 15a reaching the source-drain electrode 14.

Figure 6B:
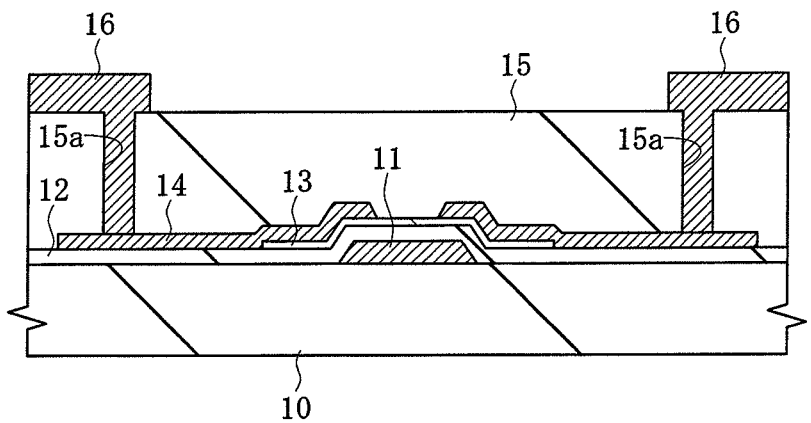
FIG. 6B is another cross-sectional view of the principal part of the thin-film transistor for explaining a step of manufacturing the thin-film transistor in which the oxide semiconductor film formed with using the oxide semiconductor target according to the first embodiment of the present invention is adopted for the channel layer.

Next, as illustrated in FIG. 6B, on an upper layer of the passivation film 15 including an inside of the contact hole 15a, a conductive film is formed. The conductive film may be a transparent conductive film such as an indium tin oxide (ITO) film, an indium zinc oxide (IZO) film, an aluminium zinc oxide (AZO) film, and a gallium zinc oxide (GZO) film, or a metal film such as an Al film and a stacked film formed of titanium (Ti) and gold (Au) (a Ti/Au stacked film). Subsequently, the conductive film is processed with using a resist pattern as a mask to form a wiring 16. Through the manufacturing process as described above, a bottom-gate top-contact thin-film transistor according to the first embodiment is substantially completed.

The characteristics of the thin-film transistor formed by the above-described manufacturing method with reference to FIGS. 5 and 6 are evaluated. For the channel layer of the thin-film transistor, the ZTO film whose thickness is 25 nm formed by the RF magnetron sputtering method with using the ZTO target is adopted. In forming the ZTO film, a substrate rotary system with 5 rpm is used. The gate electrode is formed of the stacked film of Al (whose thickness is 250 nm) and Mo (whose thickness is 50 nm), and the source/drain electrode is formed of the ITO transparent conductive film whose thickness is 150 nm formed by the sputtering method. In the thin-film transistor, the threshold potential shift is suppressed as 0.5 V or smaller for continuous use of 1000 hours. Also as other basic characteristics, good values such as a mobility of 20 $cm^2/Vs$ or larger and an on-off ratio of $10^6$ or larger can be obtained.

Figure 7:
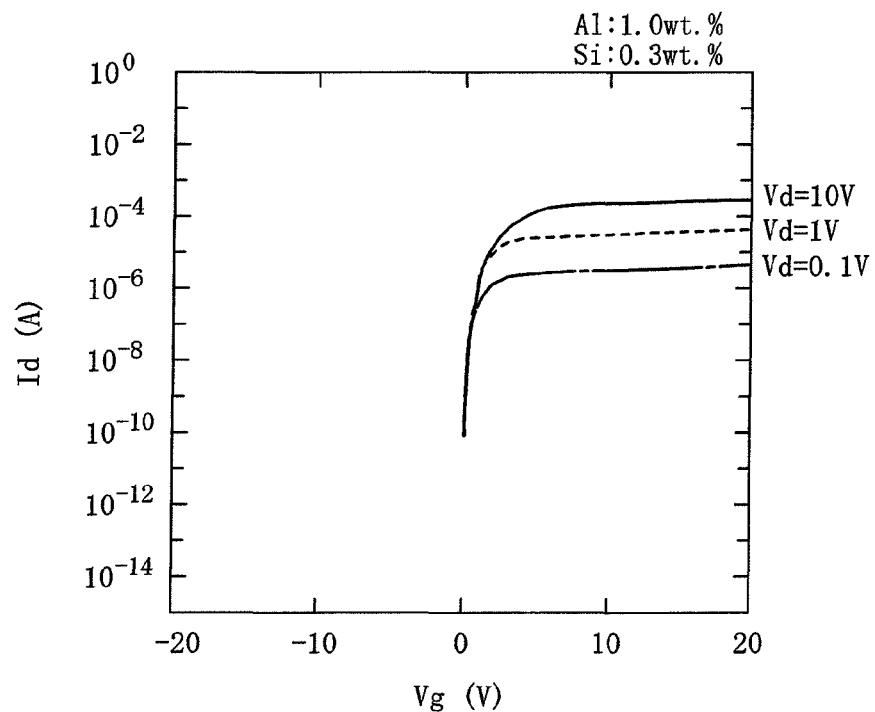
FIG. 7 is a graph illustrating current-voltage characteristics of a thin-film transistor in which an oxide semiconductor film formed with using an oxide semiconductor target with the addition of a counter doping element according to the first embodiment of the present invention is adopted for the channel layer.

FIG. 7 is a graph illustrating current (Id)-voltage (Vg) characteristics of the thin-film transistor in which the ZTO film formed by the sputtering method with using the ZTO target with the addition of the counter doping element according to the invention of the present application is adopted for the channel layer.

In spite of the impurity concentration of the mixed Al of 1.0 wt % (3.2 at %), in the thin-film transistor in which the ZTO film formed with using the ZTO target with the addition of the counter doping element (the impurity concentration of Si: 0.3 wt % (1.1 at %)) is adopted for the channel layer, the good transistor characteristics having a subthreshold slope value of 200 mV/dec or smaller can be obtained.

Figure 8:
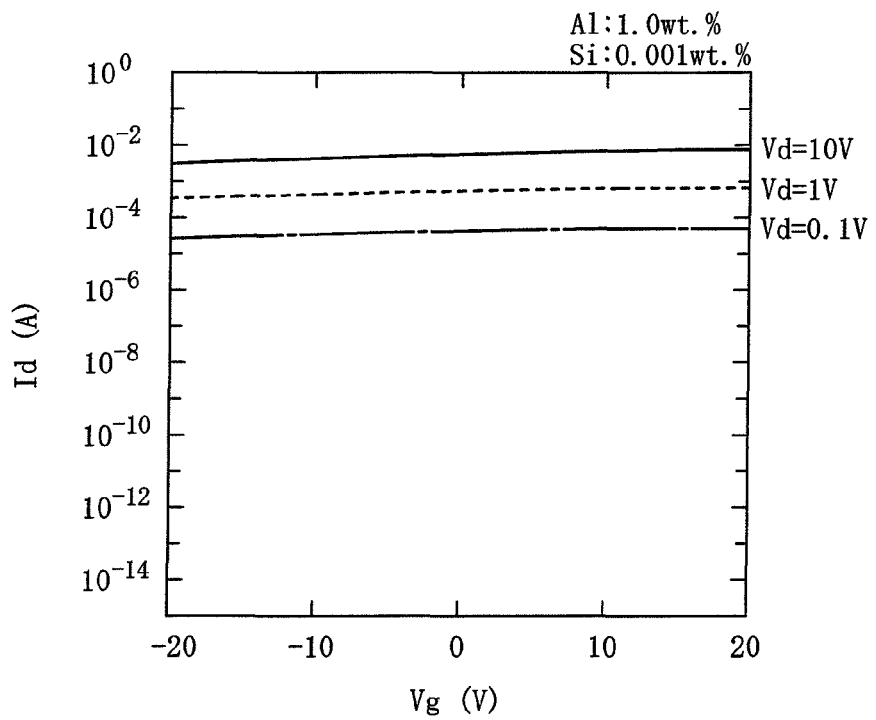
FIG. 8 is a graph illustrating current-voltage characteristics of a thin-film transistor in which an oxide semiconductor film formed with using an oxide semiconductor target without the addition of a counter doping element studied by the inventors of the present application is adopted for the channel layer.

For comparison, FIG. 8 illustrates a graph of current (Id)-voltage (Vg) characteristics of the thin-film transistor in which the ZTO film formed by the sputtering method with using the ZTO target without the addition of the counter doping element studied by the present inventors is adopted for the channel layer.

In the current-voltage characteristics of the thin-film transistor in which the ZTO film formed with using the ZTO target without the addition of the counter doping element is adopted for the channel layer, the off operation is not performed, and the characteristics are as that of a conductive film.

When the thin-film transistor having the above-described transistor characteristics illustrated in FIG. 7 is adopted for a transistor for driving an active-matrix liquid crystal display as forming an array structure, it has been found out that the thin-film transistor has the required characteristics and can be durable for practical use. Also, in the thin-film transistor in which the ZTO film formed with using the ZTO target according to the invention of the present application is adopted for the channel layer, even compared to a thin-film transistor in which amorphous silicon is adopted for the channel layer, an equivalent large area, high uniformity, and low-temperature process can be achieved. In this manner, only a cost for the ZTO target in a cost for manufacturing a panel is increased, and therefore, even when the thin-film transistor in which the ZTO film formed with using the ZTO target according to the invention of the present application is adopted for the channel layer is used, the increase of the cost for manufacturing the panel can be suppressed.

Note that, although the case that the Zn/(Zn+Sn) composition ratio is 0.7 has been described in the first embodiment, the composition ratio is not specifically limited to this. Also in other Zn/(Zn+Sn) composition ratios, while more or less change is caused in the characteristics of the wet etching, the almost same value in the characteristics of the thin-film transistor itself can be obtained.

Also, for the film-forming method, although the RF magnetron sputtering method is used, an electron cyclotron resonance (ECR) sputtering method with forming the target in a ring shape may be used, and the similar result can be obtained. Further, also in other film-forming methods except for the sputtering method, such as a deposition method, the similar result can be obtained. In addition, by using a monocrystalline substrate on which epitaxial growth is possible by a pulsed laser deposition method or others, not only the thin-film transistor but also oxide semiconductor single crystal and a device with using the oxide semiconductor single crystal can be manufactured.

Further, although the example that the invention of the present application is adopted for the bottom-gate top-contact thin-film transistor has been described in the first embodiment, the invention is not specifically limited to this structure. Also in a thin-film transistor having any structure of a bottom-gate bottom-contact type, a top-gate top-contact type, or a top-gate bottom-contact type, the almost same characteristics can be obtained. These thin-film transistors can be also used as a transistor for driving an active-matrix liquid crystal display, a current-driving device for organic EL, an RFID tag, a stacked integrated-semiconductor device, or others.

Still further, in the first embodiment, the group IV element (Si) single body is used as the counter doping element. However, also in any one type of single body of the group IV elements (C, Si, and Ge), any one type of single body of the group V elements (N, P, and As), or a combination of the group IV element and the group V element, the similar effect can be obtained.

As described above, according to the first embodiment, the alumina ball with the high hardness is used in the mixture of the raw material powder, and therefore, the raw material of the ZTO target can homogenize. Also, the concentration of the mixed impurity (for example, Al) can be easily predicted by setting the grinding condition or the mixture condition, and the concentration of the mixed impurity (for example, Si) as the counter doping element in accordance with the concentration can be set, and therefore, the impurity concentration in the manufactured ZTO target can be easily controlled. Further, while the material cost of the impurity mixed as the counter doping element is increased, other costs are not increased, and therefore, a cheap alumina ball can be used in the mixture of the raw material, and thus, the ZTO target can be provided in a low cost. From these manners, the ZTO target with the high quality in the low cost can be provided. Still further, since the oxide semiconductor layer is formed with using the ZTO target whose impurity concentration is controlled, a stable quality can be obtained also in the oxide semiconductor layer.

(Second Embodiment)

In the above-described first embodiment, the case that the invention of the present application is adopted for the ZTO target has been described. In a second embodiment, a case that the invention of the present application is adopted for an indium zinc tin oxide (IZTO) target is described.

Figure 9:
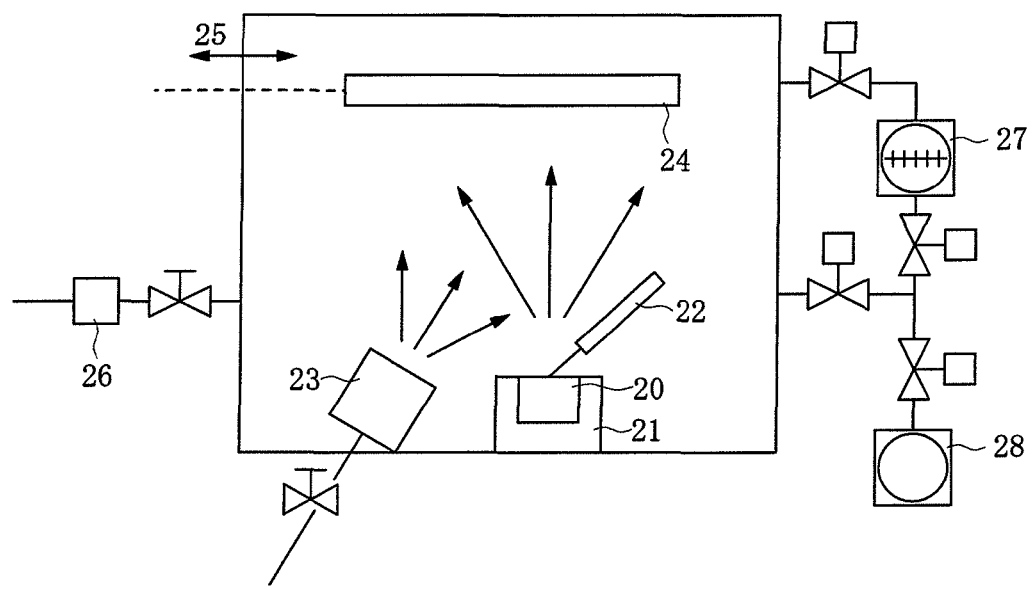
FIG. 9 is a schematic diagram of an electron-beam deposition apparatus with using an oxide semiconductor target according to a second embodiment of the present invention.

First, an example of a method of manufacturing an IZTO layer according to the second embodiment is described. The IZTO layer is formed by an electron-beam deposition method with using the IZTO target. FIG. 9 illustrates a schematic diagram of an electron-beam deposition apparatus according to the second embodiment.

In the case of the target with using the beam, a relatively-high-density target is not required, and a relatively-large-shape is not required, either, from a point of view in a beam diameter. A basic manufacturing method for the IZTO target is the same as that of the above-described first embodiment. However, in the case of not requiring the high density, the step of mixing the binder and the step of the sintering process performed at about 1300° C. can be eliminated. Also, simply, indium oxide powder, tin oxide powder, and zinc oxide powder, with high purities (for example, 99.99%), are correctly mixed so that a composition ratio thereof is as In:Zn:Sn:O=4:1:2:17, and are molded in a required shape by compression under a high-pressure condition, so that the IZTO target can be also manufactured.

In the mixture of the raw material powder, a dry-type ball mill is used. Since the alumina ball is used, the Al (the group III element) of about 0.1 to 1.0 wt % (0.3 to 3.2 at %) is mixed. Accordingly, as the counter doping material of the present invention, silicon nitride ($Si_3N_4$) powder or boron nitride (BN) powder whose concentration is about 1/10 times the impurity concentration of Al is added and mixed, so that the IZTO target is manufactured.

Similarly to the ZTO target according to the above-described first embodiment, the IZTO target for the semiconductor layer obtained by the above-described manufacturing method has a grayish-white shade caused by the less oxygen defect, and therefore, can be obviously distinguished from the oxide target having a black color caused by the more oxygen defect which is generally used as the target for forming the transparent conductive layer. Also, a resistivity of the IZTO target for the semiconductor layer obtained by the measurement by the four probe method is high as 10 Ωcm, and therefore, the IZTO target is different also in the resistivity from the target for forming the transparent conductive layer whose resistivity is $1 \times 10^{-2}$ Ωcm or lower.

The IZTO target manufactured by the above-described method can be used for, for example, the electron-beam deposition apparatus illustrated in FIG. 9. A diameter of the IZTO target is, for example, 20 mmϕ, and a thickness thereof is, for example, 10 mm. In FIG. 9, a numerical symbol 20 denotes the IZTO target, a numerical symbol 21 denotes an evaporation source, a numerical symbol 22 denotes an electron beam source, a numerical symbol 23 denotes an ion source (for ion assisting), a numerical symbol 24 denotes a substrate holder, a numerical symbol 25 denotes a substrate swinging device, a numerical symbol 26 denotes a mass flow controller, a numerical symbol 27 denotes a cryopump or a molecule turbo pump, and a numerical symbol 28 denotes a dry pump or rotary pump.

The IZTO target 20 obtained by the above-described manufacturing method is set on the evaporation source 21. Under conditions of an acceleration voltage of 6 kV and a beam current of 70 mA, a deposition speed of about 5 nm/min is obtained. By introducing oxygen ion assist from the ion source 23 in the deposition, higher-density deposition can be achieved. Also, by cooling the side of the substrate, deposition at substantially room temperature can be achieved.

Figure 10:
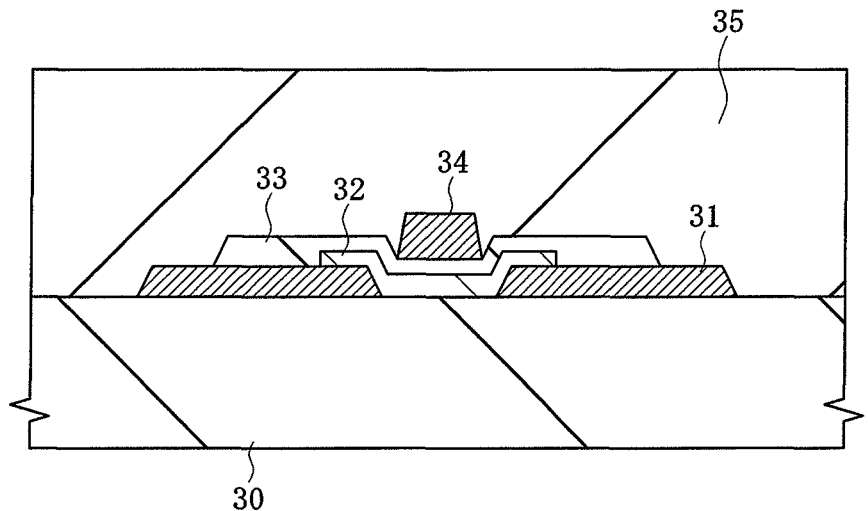
FIG. 10 is a cross-sectional view of a principal part of a thin-film transistor for explaining the thin-film transistor in which the oxide semiconductor film formed with using the oxide semiconductor target according to the second embodiment of the present invention is adopted for the channel layer.

Next, the thin-film transistor according to the second embodiment is described with reference to a cross-sectional view of a principal part of the thin-film transistor illustrated in FIG. 10. FIG. 10 is the cross-sectional view of the principal part illustrating a structure of the thin-film transistor in which the IZTO layer formed with using the IZTO target is adopted for the channel layer. The thin-film transistor according to the second embodiment is a top-gate bottom-contact thin-film transistor. In FIG. 10, a numerical symbol 30 denotes a support substrate, a numerical symbol 31 denotes a source-drain electrode, a numerical symbol 32 denotes a channel layer (IZTO layer), a numerical symbol 33 denotes a gate insulator layer, a numerical symbol 34 denotes a gate electrode, and a numerical symbol 35 denotes an interlayer insulator layer.

The IZTO layer forming the channel layer 32 of the thin-film transistor is formed by the electron-beam deposition method with using the IZTO target according to the invention of the present application. The configuration parts of the thin-film transistor except for the channel layer are formed by the same manufacturing method as that for the thin-film transistor described above in the first embodiment. A thickness of the channel layer 32 is 50 nm, and the substrate swinging device 25 is used in the deposition in order to improve a deposition distribution. The gate electrode 34 is formed of a stacked layer of Al and cobalt (Co), and the source-drain electrode 31 is formed of an ITO transparent conductive layer whose thickness is 150 nm formed by a sputtering method. A thickness of the Al layer is, for example, 250 nm, and a thickness of the Co layer is, for example, 50 nm. In the thin-film transistor, the threshold potential shift is suppressed as 0.3 V or smaller for continuous use of 1000 hours. Also as other basic characteristics, good values such as a mobility of 30 $cm^2$/Vs or larger and an on-off ratio of $10^7$ or larger can be obtained.

Figure 11:
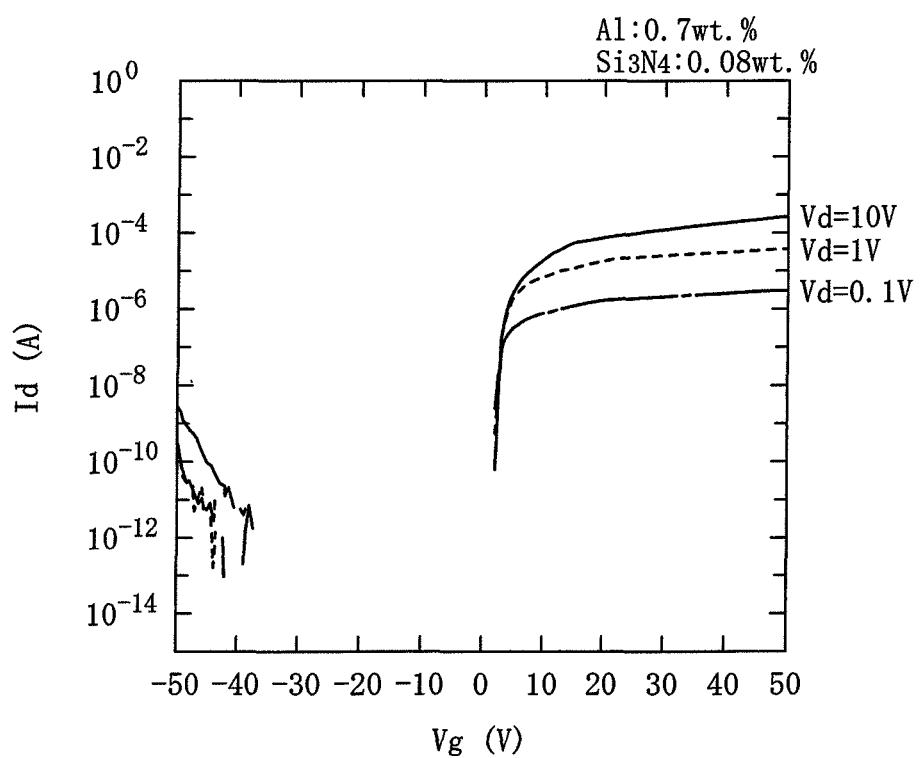
FIG. 11 is a graph illustrating current-voltage characteristics of a thin-film transistor in which an oxide semiconductor film formed by an electron-beam deposition method with using an oxide semiconductor target with the addition of a counter doping material ($Si_3N_4$) according to the second embodiment of the present invention is adopted for the channel layer.

FIG. 11 is a graph illustrating current (Id)-voltage (Vg) characteristics of the thin-film transistor in which the IZTO layer formed by the electron-beam deposition method with using the IZTO target with the addition of $Si_3N_4$ as the counter doping material is adopted for the channel layer, and FIG. 12 is a graph illustrating current (Id)-voltage (Vg) characteristics of the thin-film transistor in which the IZTO layer formed by the electron-beam deposition method with using the IZTO target with the addition of BN as the counter doping material is adopted for the channel layer.

As illustrated in FIG. 11, a good subthreshold slope value of 200 mV/dec or smaller can be obtained in the thin-film transistor in which the IZTO layer formed with using the IZTO target with the addition of $Si_3N_4$ as the counter doping material whose concentration (0.08 wt % (0.23 at %)) is about 1/10 times the impurity concentration of Al which is the group III element of 0.7 wt % (2.1 at %) is adopted for the channel layer.

Also, as illustrated in FIG. 12, a good subthreshold slope value of 300 mV/dec or smaller can be obtained in the thin-film transistor in which the IZTO layer formed with using the IZTO target with the addition of BN as the counter doping material whose concentration (0.08 wt % (0.24 at %)) is about 1/10 times the impurity concentration of Al which is the group III element of 0.7 wt % (2.1 at %) is adopted for the channel layer. In the addition at manufacturing the sintered oxide, B has a high vapor pressure, and is not captured into the sintered oxide, and therefore, is evaporated as gas, and thus, a counter-doping amount of N can be controlled by the additional amount of BN.

For comparison, FIG. 13 illustrates a graph of current (Id)-voltage (Vg) characteristics of the thin-film transistor in which the IZTO layer formed by the electron-beam deposition method with using the IZTO target without the addition of the counter doping material studied by the present inventors is adopted for the channel layer.

In the current-voltage characteristics of the thin-film transistor in which the IZTO layer formed with using the IZTO target without the addition of the counter doping material is adopted for the channel layer, the off operation is not performed, and the characteristics are as that of a conductive layer.

Note that the thin-film transistor in which the IZTO layer formed with using the IZTO target according to the second embodiment is adopted for the channel layer is excellent in compatibility for an integrated structure with a bottom-emission-type organic EL element as an active-matrix array. Also, the thin-film transistor can be used for, in addition to the display, a memory element, an RFID tag, a stacked integrated-semiconductor device, or others.

Further, in the second embodiment, the combination of the group IV element (Si) and the group V element (N) is used as the counter doping material. However, also in any one type of single body of the group IV elements (C, Si, and Ge), any one type of single body of the group V elements (N, P, and As), or a combination of the group IV element and the group V element, the similar effect can be obtained.

Still further, in the second embodiment, the IZTO target is mainly described. However, also in other oxide semiconductor materials such as zinc oxide, tin oxide, gallium oxide, tungsten oxide, titanium oxide, indium zinc oxide, and indium gallium zinc oxide, the similar effect can be obtained.

Still further, in the second embodiment, the electron-beam deposition method is used as the film-forming method. However, a resistance heating evaporation method, an ion plating method, or a pulsed laser deposition method may be used, and the similar effect can be obtained by these methods.

As described above, according to the second embodiment, by adding the counter doping material to the IZTO target, the IZTO target with the high quality in the low cost can be provided as similar to the above-described first embodiment, and a stable quality can be obtained also in the oxide semiconductor layer formed with using the IZTO target.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be adopted for an oxide semiconductor target and an oxide semiconductor layer formed with using the oxide semiconductor target by a sputtering method, a deposition method, or others.

What is claimed is:

1. An oxide semiconductor target formed of a sintered oxide mainly made of zinc oxide and tin oxide, wherein
at least one group IV element, at least one group V element other than nitrogen, or a combination of group IV and group V elements are added to the sintered oxide, and
an impurity concentration of the at least one group IV element, an impurity concentration of the at least one group V element other than nitrogen, or an impurity concentration of the combination of group IV and group V elements is equal to or less than ½ times a total group III impurity concentration contained in the sintered oxide.

2. The oxide semiconductor target according to claim 1, wherein
the impurity concentration of the at least one group IV element, the impurity concentration of the at least one group V element other than nitrogen, or the impurity concentration of the combination of group IV and group V elements is equal to or less than 1/10 times the total group III impurity concentration.

3. The oxide semiconductor target according to claim 1, wherein
the total group III impurity concentration is equal to or less than 3.0 at %.

4. The oxide semiconductor target according to claim 1, wherein
the group III impurity includes any one of B, Al, Ga, and In, or a combination of two or more of B, Al, Ga, and In.

5. The oxide semiconductor target according to claim 1, wherein
the at least one group IV element includes C, Si, Ge or a combination of two or more of C, Si, and Ge.

6. The oxide semiconductor target according to claim 1, wherein
the group V element other than nitrogen includes P, As, or a combination of P and As.

7. The oxide semiconductor target according to claim 1, wherein
a resistivity of the oxide semiconductor target is equal to or larger than $1 \times 10^{-1}$ Ωcm.

8. The oxide semiconductor target according to claim 1, wherein
a relative density of the sintered oxide is equal to or higher than 95%.

9. An oxide semiconductor target formed of a sintered oxide mainly made of zinc oxide and tin oxide, wherein
one or more counter-dopants selected from the group consisting of C, Si, Ge, P, and As, is added to the sintered oxide, with a total concentration equal to or less than ½ times a total group III impurity concentration contained in the sintered oxide.

10. The oxide semiconductor target of claim 1, wherein the group III impurity is aluminum.

11. The oxide semiconductor target of claim 9, wherein the group III impurity is aluminum.

12. An oxide semiconductor target formed of a sintered oxide mainly made of zinc oxide and tin oxide, and containing aluminum as an impurity, wherein
at least one group IV element, at least one group V element, or a combination of group IV and group V elements is added to the sintered oxide, and
an impurity concentration of the at least one group IV element, an impurity concentration of the at least one group V element, or an impurity concentration of the combination of group IV and group V elements is equal to or less than ½ times an impurity concentration of the aluminum contained in the sintered oxide.

* * * * *